United States Patent [19]

den Boef et al.

[11] Patent Number: 5,319,309
[45] Date of Patent: Jun. 7, 1994

[54] MAGNETIC RESONANCE DEVICE AND SIGNAL COMBINATION DEVICE

[75] Inventors: Johannes H. den Boef; Peter H. Wardenier, both of Eindhoven, Netherlands

[73] Assignee: U.S. Philips Corporation, New York, N.Y.

[21] Appl. No.: 981,703

[22] Filed: Nov. 25, 1992

[30] Foreign Application Priority Data

Nov. 29, 1991 [EP] European Pat. Off. ........ 91203132.5

[51] Int. Cl.$^5$ .............................................. G01V 3/00
[52] U.S. Cl. ..................................... 324/309; 324/307
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,577,152 | 3/1986 | Macovski | 324/309 |
| 4,665,366 | 5/1987 | Macovski | 324/309 |
| 4,825,162 | 4/1989 | Roemer et al. | 324/318 |
| 4,918,387 | 4/1990 | McKinnon et al. | 324/309 |

FOREIGN PATENT DOCUMENTS

| | | |
|---|---|---|
| 0467378 | 1/1992 | European Pat. Off. |
| 0460761 | 11/1992 | European Pat. Off. |
| 8905115 | 7/1987 | World Int. Prop. O. |

*Primary Examiner*—Michael J. Tokar
*Attorney, Agent, or Firm*—Jack D. Slobod

[57] ABSTRACT

A known magnetic resonance device (1) operates with a coil array (c1 to cn) which serves as a detection coil whereby magnetic resonance signals are detected so as to form partial images of a sub-volume of an object (5) to be measured. A signal processing unit (9) forms an overall image from the partial images. Because the known device utilizes separate detection and signal acquisition channels, it is comparatively expensive and complex. In accordance with the invention, a simpler and less expensive magnetic resonance device (1) is obtained in that the device comprises a signal combination device (28) which shifts frequency ranges (s1 to sn) of individual coil elements in the coil array in respect of frequency and which forms, from the shifted frequency ranges (o1 to on) a sum signal (sm) in which the frequency ranges are separated from one another. As a result, many common circuits can be saved, without leading to a loss of flexibility of the device (1), so that the advantages of fully separated channels are retained.

9 Claims, 3 Drawing Sheets

MAGNETIC RESONANCE DEVICE AND SIGNAL COMBINATION DEVICE

BACKGROUND OF THE INVENTION

1. Field of the Invention

The invention relates to a magnetic resonance device, comprising a main field magnet for generating a steady magnetic field in a measuring space for accommodating an object, a coil system for generating a gradient magnetic field, and an RF coil system which consists of several coil elements for detection of magnetic resonance signals to be generated in the object.

2. Description of the Related Art

A magnetic resonance device of this kind is known from the international Patent Application WO 89/05115. The magnetic resonance device disclosed in the cited Patent Application is used to form partial images from magnetic resonance signals originating from separate coil elements. The partial images are combined so as to form an ultimate image of a subvolume of the object measured by means of the RF coil system. The signals from the individual coil elements are detected in separate detection channels, are sampled and subsequently applied to processing means, completely independently from one another, in order to form the partial images and the ultimate image. The combination of the partial images so as to form an ultimate image should be executed pixel-wise in order to prevent the addition of noise. Because signal processing of the signals in the detection channels is performed in a completely independent manner, no restrictions exist as regards the orientation of the RF coil system relative to a measuring gradient field direction, i.e. given a predetermined measuring gradient field direction associated with a measuring sequence for executing a given magnetic resonance measurement, a free choice exists as regards the orientation of the RF coil system. The described magnetic resonance device, however, is comparatively expensive and complex because a separate detection channel is required for each individual coil element. Furthermore, generally speaking, several cable passages from a signal detection system arranged within a shielded measuring space of the magnetic resonance device to processing means situated outside the shielded space will be required.

SUMMARY OF THE INVENTION

It is the object of the invention to provide a magnetic resonance device which is cheaper and simpler.

A magnetic resonance device in accordance with the invention is characterized in that the magnetic resonance device comprises a signal combination device which is operative to shift frequency ranges of individual coil elements in respect of frequency and to combine the shifted frequency ranges so that on a sum output of the signal combination device there is formed a sum signal in which the frequency ranges are at least substantially separated from one another. Because signal combination already takes place in the RF section of the magnetic resonance device, the construction of each detection channel may be simpler. The signal shifting and combination are executed so that the advantages of a device comprising separate channels up to data processing are maintained, i.e. the orientation of the coil system relative to a measuring gradient can still be chosen completely as desired.

It is to be noted that even though EP-A-0 460 761, being prior art for the purposes of the European Patent Office counterpart of this application in conformity with Article 54(3) EPC), mentions signal combination, the frequency ranges of the various coil elements therein need be separated from one another as from the very start, which implies that when a linear array is used as the RF coil system, a longitudinal axis of the array is substantially coincident with a measuring gradient field direction of a measuring gradient in a measuring sequence.

An embodiment of a magnetic resonance device in accordance with the invention is characterized in that the signal combination device for the individual coil elements comprises first frequency shifting devices which are coupled to the coil elements and outputs of which are coupled to fixed or adjustable bandpass filters which are coupled to a signal summing device for supplying the sum signal. Thus, a signal combination device is obtained which requires a minimum amount of hardware, even though it is no longer possible to use subsequently connected commercially available standard hardware because the transmission frequency in the magnetic resonance device deviates from the receiving frequency.

This drawback is mitigated in a magnetic resonance device in accordance with the invention which is characterized in that the signal combination device for the individual coil elements comprises second frequency shifting devices which are connected so as to precede the signal summing device, or comprises one second frequency shifting device which is connected subsequent to the signal summing device. As a result, the hardware connected subsequent to the signal combination device may be standard hardware.

A preferred embodiment of a magnetic resonance device is characterized in that in the presence of second frequency shifting devices connected so as to precede the signal summing device, the bandpass filters are adjusted to substantially the same central frequency. It is thus achieved that the design of the device is simpler; this is the case notably when use is made of fixed bandpass filters, that are commercially available.

A further embodiment of a magnetic resonance device in accordance with the invention is characterized in that the coil elements are arranged in a linear array. The magnetic resonance device in accordance with the invention can then be advantageously used for many customary magnetic resonance examinations, such as the examination of a spine. Using a surface coil configuration as an array, high-quality low-noise images can be obtained across a comparatively wide field of view. Furthermore, the invention allows for a substantially unlimited number of two-dimensional as well as three-dimensional coil configurations.

BRIEF DESCRIPTION OF THE DRAWING

The invention will be described in detail hereinafter with reference to a drawing; therein.

DETAILED DESCRIPTION OF THE PREFERRED EMBODIMENTS

Figure 1:
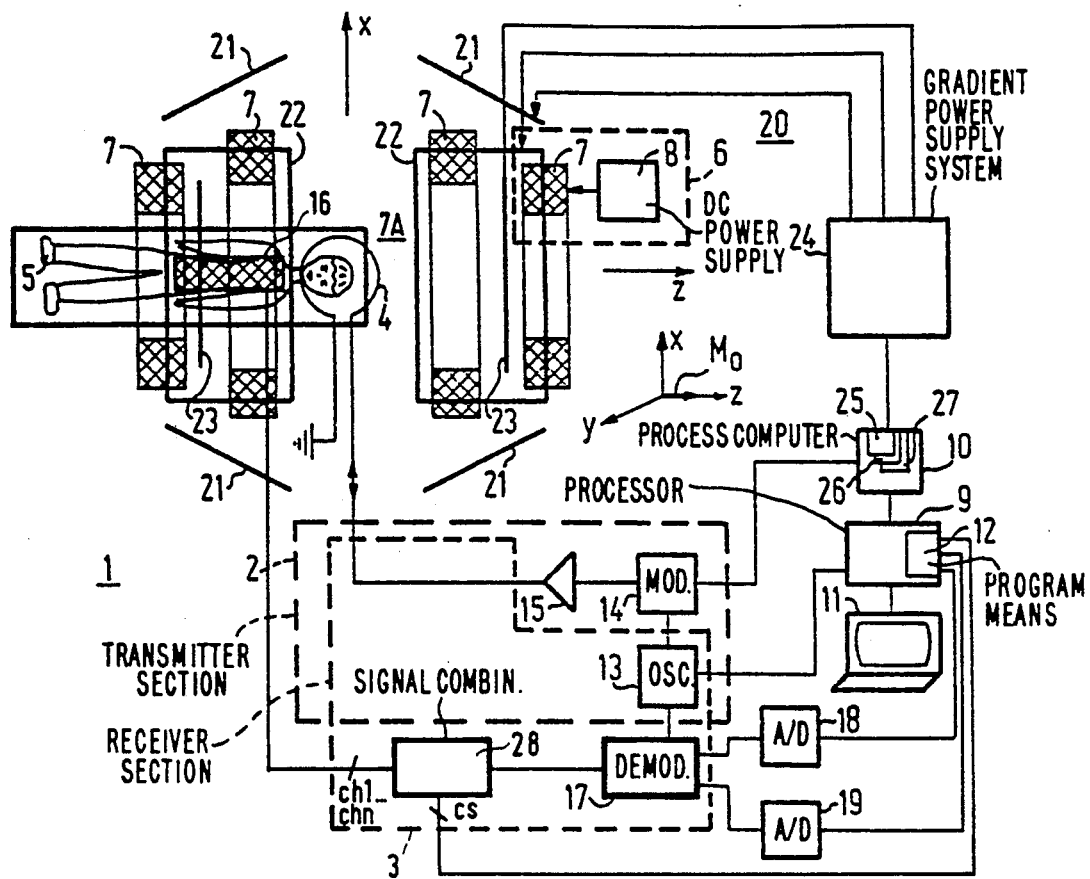
FIG. 1 shows diagrammatically a magnetic resonance device in accordance with the invention.

FIG. 1 shows diagrammatically a magnetic resonance device 1 in accordance with the invention, comprising transmitter section 2 and receiver section 3 for transmitting RF electromagnetic pulses, via a transmitter coil 4, to an object 5 and for receiving magnetic resonance signals from the object 5 by means of an RF coil system 16, respectively, which magnetic resonance signals are generated, by the RF electromagnetic pulses, in the object 5 which is situated in a steady, uniform magnetic field. The device 1 comprises means 6 for generating the steady field. The means 6 comprise a main field magnet 7 and, in the case of a resistive magnet or a superconducting magnet, a DC power supply 8. In the presence of a permanent magnet, the DC power supply 8 is omitted. During operation of the device 1 with the object 5 arranged within the magnet coils 7 in a measuring space 7A, a slight excess of nuclear spins (of nuclei having a magnetic moment) will be oriented in the same direction as the steady field in the state of equilibrium. From a macroscopic point of view this is to be considered as a magnetization $M_0$, being an equilibrium magnetization. The device 1 furthermore comprises processor 9 which is coupled to the transmitter section 2 and the receiver section 3, a process computer 10 which is coupled to the processor 9 and the transmitter section, and a display 11 for displaying a nuclear magnetization distribution which is determined, using programmed means 12, from resonance signals received by the receiver section 3, after demodulation and signal sampling thereof (detection of resonance signals). More specifically, the transmitter section 2 comprises an RF oscillator 13 for generating a carrier signal, a modulator 14 for amplitude and/or phase and frequency modulation of the carrier signal, and a power amplifier 15 which is coupled to the transmitter coil 4. The RF oscillator 13 is coupled to the processor 9 and the modulator 14 is coupled to the process computer 10. When excitation pulses having a frequency contents around the so-called Larmor frequency of, for example protons, are applied to the object 5 under the control of the programmed means 12 and via the transmitter section 2, there will be produced magnetic resonance signals wherefrom a proton nuclear spin distribution or a magnetic resonance image can be determined by the programmed means 12 utilizing, for example Fourier transformation. The receiver section 3 for receiving the resonance signals comprises a demodulation unit 17. The unit 17 may comprise a double phase-sensitive detector, the output signals of which are sampled by means of a first and a second analog-to-digital converter 18, 19. The A/D converters 18 and 19 are coupled to the processor 9. The transmitter and receiver sections 2, 3 may alternatively be formed by a so-called phase coherent digital transmitter/receiver. The device 1 furthermore comprises means 20 for generating magnetic field gradients superposed on the steady, uniform field. The means 20 comprise gradient magnet coils 21, 22 and 23 for generating magnetic field gradients $G_x$, $G_y$ and $G_z$, respectively, and a gradient power supply system 24 which can be controlled by the process computer 10 and which comprises gradient amplifiers (not shown) for powering the separately activatable gradient magnet coils 21, 22 and 23. The process computer 10 comprises digital-to-analog converters (DACs) 25, 26 and 27 in order to supply the gradient power supply system 24, while supplying digital codes and under the control of the process computer 10, with analog gradient waveforms whereby the respective gradients $G_x$, $G_y$ and $G_z$ are generated. In the embodiment shown, the arrangement of the gradient magnet coils in space is such that the field direction of the magnetic field gradients coincides with the direction of the steady, uniform magnetic field and that the gradient directions extend perpendicularly to one another as denoted by three mutually perpendicular axes x, y and z in FIG. 1. The magnetic resonance signals wherefrom a nuclear spin distribution can be reconstructed by means of Fourier transformation are obtained by means of so-called measuring sequences. In accordance with the invention, the RF coil system 16 is connected to the otherwise common demodulation unit 17 via a signal combination device 28, which demodulation unit may be a commercially available unit. The signal combination device 28 can be activated by the processing means 9, via the programmed means 12.

Figure 2:
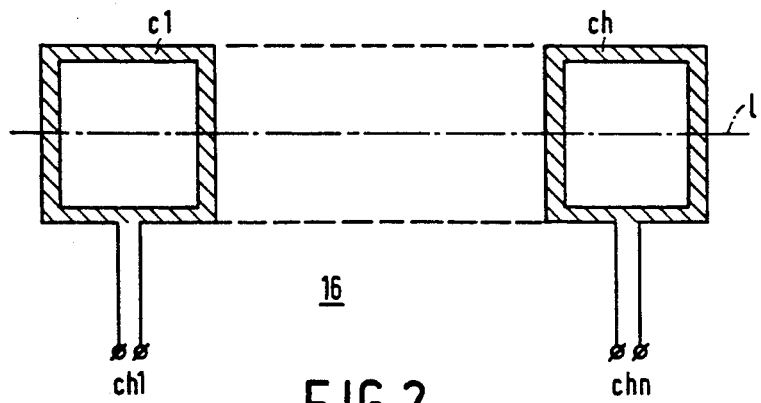
FIG. 2 shows an RF coil system in the form of a linear array.

FIG. 2 shows an RF coil system 16 in the form of a linear array, comprising separate coil elements c1 to cn which are coupled to n channels ch1 to chn of the signal combination device 28. The coil elements c1 to cn are arranged along a longitudinal axis 1. The coil elements may partly overlap one another and no strict requirements are imposed as regards mutual decoupling. Besides the coil configuration shown, a substantially unlimited number of coil configurations, two-dimensional as well as three-dimensional, are feasible for a magnetic resonance device 1 in accordance with the invention.

Figure 3:
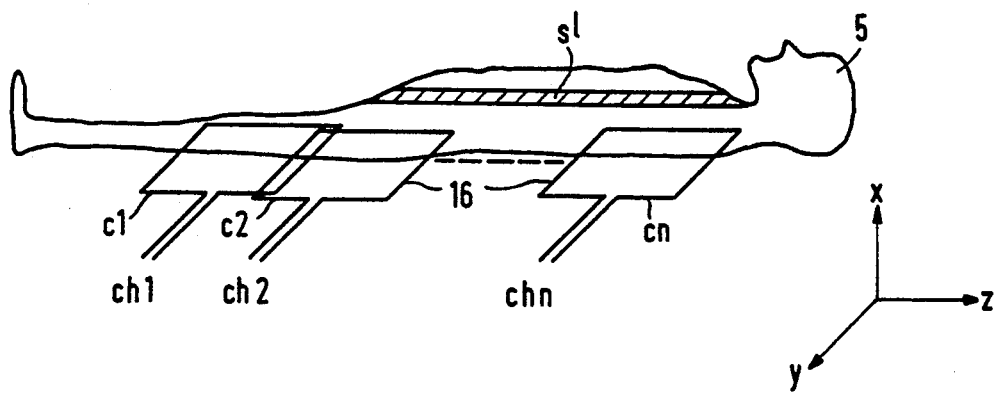
FIG. 3 shows an object positioned relative to a linear array.

FIG. 3 shows an object 5 positioned relative to a linear array 16 of surface coils c1 to cn. Also shown is a system of coordinates xyz. In accordance with the invention, the linear array 16 detects magnetic resonance signals which have been generated by means of measuring sequences, such as a known spin-warp measuring sequence, and which originate from sub-volumes of, for example a slice s1 of the object 5, the processing means 9 reconstructing partial images therefrom which are combined so as to form an ultimate image. In the present example, when a measuring gradient is chosen in the y direction, the measuring gradient will not coincide with the longitudinal direction l of the linear array 16, so that frequency ranges of the resonance signals measured by means of the individual coil elements c1 to cn will be coincident at least to a high degree. Using the signal combination device 28 in accordance with the invention, these frequency ranges are shifted so that a sum signal is formed in which the frequency ranges are separated from one another. The sum signal is applied to the unit 17 for further processing. In the present example, a slice s1 extending parallel to the yz plane is shown. In accordance with the invention, however, no restrictions are imposed as regards directions of measurement relative to the RF coil system 16 and measurement can be performed in arbitrary directions by means of known measuring sequences.

Figure 4:
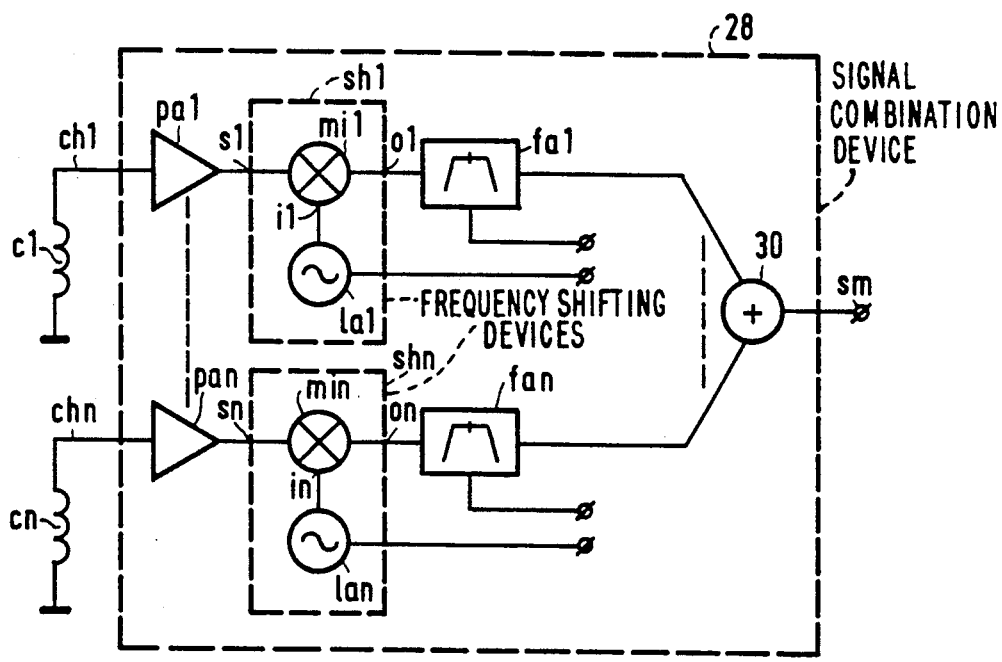
FIG. 4 shows an embodiment of a signal combination device in accordance with the invention.

FIG. 4 shows an embodiment of a signal combination device 28 in accordance with the invention. The signal combination device 28 comprises n input channels ch1 to chn which are coupled to the individual coil elements c1 to cn, respectively. The channels ch1 to chn comprise signal preamplifiers pa1 to pan which are coupled to first frequency shifting devices sh1 to shn, output signals of which are coupled, via bandpass filters fa1 to fan which may be fixed or adjustable, to a signal summing device 30 which supplies a sum signal to be further processed by the unit 17. The first frequency shifting devices sh1 to shn comprise mixing circuits mi1 to min which include a signal input s1 to sn for receiving signals preamplified by the signal preamplifiers pa1 to pan. The preamplified signals are mixed in the mixing circuits mi1 to min with respective signals from frequency-controllable oscillators la1 to lan which are applied, via oscillator inputs i1 to in, to the mixing circuits mi1 to min. The mixing circuits mi1 to min also comprise mixing signal outputs o1 to on for supplying mixing signals to be applied to the adjustable bandpass filters fa1 to fan. The bandpass filters fa1 to fan are coupled to the signal summing device 30. Control signals for the oscillators and the bandpass filters are supplied by the processing means 9 and/or the process computer 10 and are denoted by the reference cs in FIG. 1.

Figure 5:
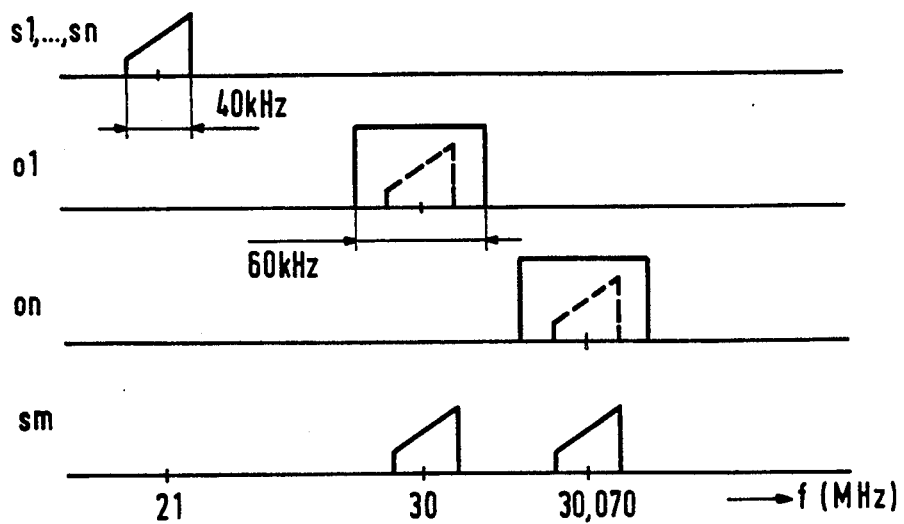
FIG. 5 illustrates frequency shifting and combination in accordance with the invention.

FIG. 5 shows frequency shifting and combination in accordance with the invention as a function of the frequency f in MHz, on the basis of which the operation of the signal combination device 28 shown in FIG. 4 will be described. The description is based on the example described with reference to FIG. 3, i.e. the measuring direction is chosen so that the individual coil elements "perceive" substantially the same frequency range of the detected magnetic resonance signals, for example a frequency range of 40 kHz around an RF signal of 21 MHz; a transmission frequency of the magnetic resonance device 1, i.e. the field strength of the main field is then approximately 0.5 T, measurement being performed on protons. For a given field strength $B_0$ the transmission frequency is determined by the known Larmor relation, reception frequencies of the magnetic resonance signals being co-dependent in known manner on the applied gradient magnetic fields. The signals at the signal inputs s1 to sn of the first frequency shifting devices sh1 to shn are mixed in the mixing circuits mi1 to min so that frequency-shifted, non-overlapping signals appear at the respective outputs o1 to on of the mixing circuits mi1 to min. The frequency-shifted signals are applied to the bandpass filters fa1 to fan which have a bandwidth of, for example 60 kHz. In the example shown, it has been assumed for the sake of simplicity that n=2. After filtering and summing, a sum signal sm is obtained in which the frequency ranges of the individual coil elements are separated from one another. The bandpass filters fa1 to fan are adjusted so that they are centred around frequency bands of the signals to be filtered. Use can alternatively be made of fixed, preadjusted bandpass filters. In the present example, central frequencies of 30 and 30.070 MHz have been adjusted. The mixing frequencies may then be 9 and 9.07 MHz and 51 and 51.070 MHz, respectively, depending on whether a mixing product is used in the form of a sum signal or a difference signal. Use can also be made of single sideband techniques. If it is known a priori that the bandwidth of the signals to be received is comparatively narrow, for example 10 kHz, partial overlapping of filter bands is permissible, resulting in a smaller overall bandwidth of the sum signal. Without overlapping, the overall bandwidth at least equals n times the bandwidth of one channel. When mutual coupling of the individual coil elements is involved, appropriate correction can be performed in the processing means 9. The bandpass filters suppress noise signals outside the relevant frequency ranges, so that these noise signals will be present in irrelevant frequency ranges of other channels, resulting in an as high as possible overall signal-to-noise ratio. In the event that the object 5 produces a signal having a bandwidth which is greater than that of the relevant signal (the field of view of the area of interest is smaller than the dimension of the object 5 in the direction of the measuring gradient), undesirable parts of the magnetic resonance signal will also be suppressed. In the absence of suppression of undesirable magnetic resonance signals, image artefacts will occur in neighbouring channels. Generally speaking, the adjustment of the oscillators is determined on the basis of the a priori known orientation of the RF coil system 16 and the a priori known measuring sequence to be used, which means that it is known in advance which gradients will be successively switched. The direction and the intensity of the measuring gradient codetermines whether, and to what extent, frequency ranges of the individual coil elements will overlap.

Figure 6:
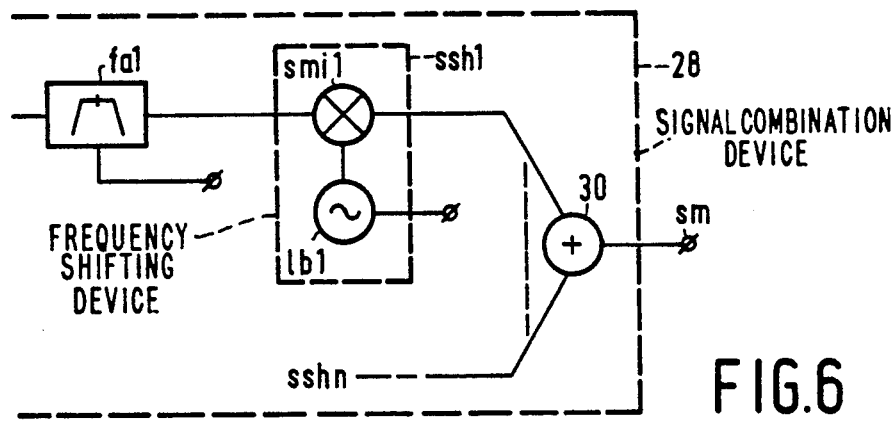
FIG. 6 shows a preferred embodiment of a signal combination device in accordance with the invention.

FIG. 6 shows a preferred embodiment of a signal combination device 28 in accordance with the invention which is identical to the device 28 shown in FIG. 4, except that in all channels ch1 to chn second frequency shifting devices ssh1 to sshn are connected between the bandpass filters fa1 to fan and the signal summing device 30. The second frequency shifting devices ssh1 to sshn, only the frequency shifting device ssh1 being shown, comprise mixing circuits smi1 to smin which mix oscillator signals from frequency-controllable oscillators lb1 to lbn (only lbn is shown) with output signals of the bandpass filters fa1 to fan. In this version, for input frequency ranges around 21 MHz, the oscillators la1 to lan can be adjusted to frequencies which shift the frequency ranges to frequencies around 25 MHz, i.e. to frequencies around 46 MHz when a difference signal is formed as the mixing product. The oscillators lb1 to lbn can also be adjusted to about 46 MHz when difference signals are formed. In this version the bandpass filters may be identical, enabling a simpler design. The output signal of the signal combination device 28 can be applied to standard hardware.

Figure 7:
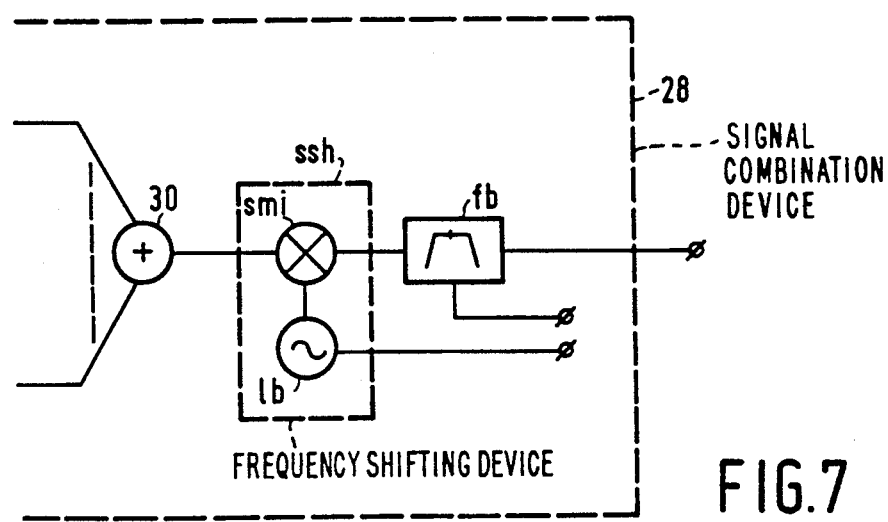
FIG. 7 shows a further embodiment of a signal combination device in accordance with the invention.

FIG. 7 shows another embodiment of a signal combination device 28 in accordance with the invention whose construction is identical to that of the device shown in FIG. 4, except that a second frequency shifting device ssh is connected subsequent to the signal summing device 30. The second frequency shifting device ssh has the same construction as the first frequency shifting devices ssh 1 to sshn and comprises a mixing circuit smi and a controllable oscillator lb. The mixing circuit smi is coupled, at its output side, to a filter fb which ensures that undesirable mixing products are filtered out. For input frequency ranges around 21 MHz, the oscillators la1 to lan in this version are adjusted to approximately 9 or 51 MHz, depending on the mixing product to be formed, and the oscillator lb is adjusted to a frequency which corresponds substantially to the mean frequency of the oscillators la1 to lan. Therefore, the first frequency shifting devices sh1 to shn provide frequency separation and the second frequency shifting device ensures that the sum signal is shifted to a frequency band of commercially available standard hardware so as to be further processed.

Within the scope of the present invention it is also possible to provide a magnetic resonance device comprising several signal combination devices 28 and demodulation units 17.

We claim:

1. A magnetic resonance device comprising a main field magnet for generating a steady magnetic field in a measurement space for receiving an object to be examined, a gradient coil system for generating a gradient magnetic field in the measurement space, and an RF coil system which comprises a plurality of individual coil elements, each for detection of magnetic resonance signals generated in the object within a predetermined frequency range, and a signal combination device having respective inputs for receiving the magnetic resonance signals detected by the plurality of individual coil elements, and being operative to differently shift the frequency ranges of the magnetic resonance signals detected by the respective individual coil elements in order to form a combined signal at an output of said signal combination device in which the differently shifted frequency ranges are substantially separated from each other.

2. A magnetic resonance device as claimed in claim 1, wherein the signal combination device comprises a plurality of first frequency shifting devices each having an input coupled to a different one of the individual coil elements and each having an output coupled to a different one of a plurality of bandpass filters, which plurality of bandpass filters are coupled to a signal summing device for supplying the combined signal.

3. A magnetic resonance device as claimed in claim 2, wherein the signal combination device comprises second frequency shifting devices which are connected so as to precede the signal summing device, or comprises one second frequency shifting device which is connected subsequent to the signal summing device.

4. A magnetic resonance device as claimed in claim 2, wherein the first frequency shifting devices (sh1 to shn) comprise mixing circuits which have an input for receiving a signal to be mixed, an oscillator input which is coupled to a frequency-controllable oscillator, and a mixing signal output for supplying a mixing signal.

5. A magnetic resonance device as claimed in claim 3, wherein the second frequency shifting devices are connected so as to precede the signal summing device, and the band filters are adjusted to substantially the same central frequency.

6. A magnetic resonance device as claimed in claim 1, wherein the individual coil elements are arranged in a linear array.

7. A magnetic resonance device as claimed in claim 2, wherein signal preamplifier is connected between the individual coil elements and the first frequency shifting devices.

8. A magnetic resonance device as claimed in claim 1, characterized in that it comprises more than one signal combination device.

9. A signal combination device which is suitable for use in a magnetic resonance device (1) as claimed in claim 1.

* * * * *